United States Patent
Deng et al.

(10) Patent No.: US 7,391,501 B2
(45) Date of Patent: Jun. 24, 2008

(54) IMMERSION LIQUIDS WITH SILOXANE POLYMER FOR IMMERSION LITHOGRAPHY

(75) Inventors: Hai Deng, Mountain View, CA (US); Yueh Wang, Portland, OR (US); Huey-Chiang Liou, Fremont, CA (US); Hok-Kin Choi, San Jose, CA (US); Robert M. Meagley, Hillsboro, CA (US); Ernisse Putna, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 534 days.

(21) Appl. No.: 10/763,467

(22) Filed: Jan. 22, 2004

(65) Prior Publication Data

US 2005/0164502 A1 Jul. 28, 2005

(51) Int. Cl.
*G03B 27/54* (2006.01)
(52) U.S. Cl. .......................................... 355/67
(58) Field of Classification Search ............. 355/30, 355/53, 67
See application file for complete search history.

(56) References Cited

U.S. PATENT DOCUMENTS 7,029,832 B2 * 4/2006 Rolland et al. .............. 430/322
2002/0163629 A1 * 11/2002 Switkes et al. ................ 355/53

OTHER PUBLICATIONS

Myoung Soo Kim, et al.; Effect on Salt on the Dissolution of Novolak in Base; Mar. 1997; SPIE, vol. 3049; pp. 528-534.
M. Switkes, et al.; Resolution Enhancement of 157 nm Lithography by Liquid Immersion; 2002; SPIE, vol. 4691; pp. 459-465.
Soichi Owa, et al.; Immersion lithography, its potential performance and issues; 2003; SPIE, vol. 5040; pp. 724-733.
M. Switkes, et al.; Immersion Liquids for Lithography in the Deep Ultraviolet; 2003; SPIE, vol. 5040; pp. 690-699.

* cited by examiner

*Primary Examiner*—Diane Lee
*Assistant Examiner*—Chia-how Michael Liu
(74) *Attorney, Agent, or Firm*—Fish & Richardson P.C.

(57) ABSTRACT

Compositions for immersion liquid materials and associated immersion lithography systems and techniques. Examples of polymer or oligomer-based immersion liquids are described to exhibit superior material properties for immersion lithography in comparison with water and some other commonly-used immersion liquids. In addition, certain material additives may be added to water and water-based immersion liquids to improve the performance of the immersion liquids in immersion lithography.

13 Claims, 1 Drawing Sheet

IMMERSION LIQUIDS WITH SILOXANE POLYMER FOR IMMERSION LITHOGRAPHY

All rights in connection with this application are assigned to Intel Corporation.

This application relates to photolithography, and more particularly to immersion photolithography.

Photolithography is a process that optically transfers a geometric pattern on a mask onto a photoresist layer over a substrate such as a silicon wafer by first exposing the photoresist layer to the optical image of the mask and then chemically developing the exposed photoresist layer to form the designed pattern. An optical imaging system is used to project the pattern on the mask to the photoresist layer. In many applications, it is desirable to make the feature size of the projected pattern on the photoresist layer as small as possible in order to increase the number of components and devices integrated in a given chip area.

In general, the imaging resolution on the photoresist layer is proportional to the wavelength of the light used to produce the optical image on the photoresist layer and is inversely proportional to the optical numerical aperture (NA) of the optical imaging system. Hence, the minimum pitch in the projected images on the photoresist layer may be reduced by reducing the optical wavelength, increasing the numerical aperture of the imaging system, or using a combination of both. As an continuous effort in improving the image resolution, various light sources have been developed to reduce the optical wavelength in photolithography from the UV spectral range to the deep UV spectral range at 248 nm or even shorter wavelengths such as the sub-200-nm range (e.g., 193 nm or 157 nm).

At a given optical wavelength, the numerical aperture of the optical imaging system may be increased to reduce the minimum pitch size in the projected image on the photoresist layer. Immersion lithography systems achieve a large numerical aperture by filling the air space between the optical imaging system and the photoresist layer with an immersion liquid having a refractive index of n. Hence, light from the imaging system transmits through the immersion liquid to reach the photoresist. The use of the immersion liquid increases the NA by a factor of n in comparison with the NA of the same system without the immersion liquid. Water, for example, may be used as the immersion liquid.

DETAILED DESCRIPTION

This application describes examples of new compositions for immersion liquid materials and associated immersion lithography systems, and techniques. Examples of polymer or oligomer-based immersion liquids are described with superior material properties for immersion lithography in comparison with water and some other commonly-used immersion liquids. In addition, certain material additives may be added to water-based immersion liquids to improve the performance of the water-based immersion liquids in immersion lithography.

Figure 1:
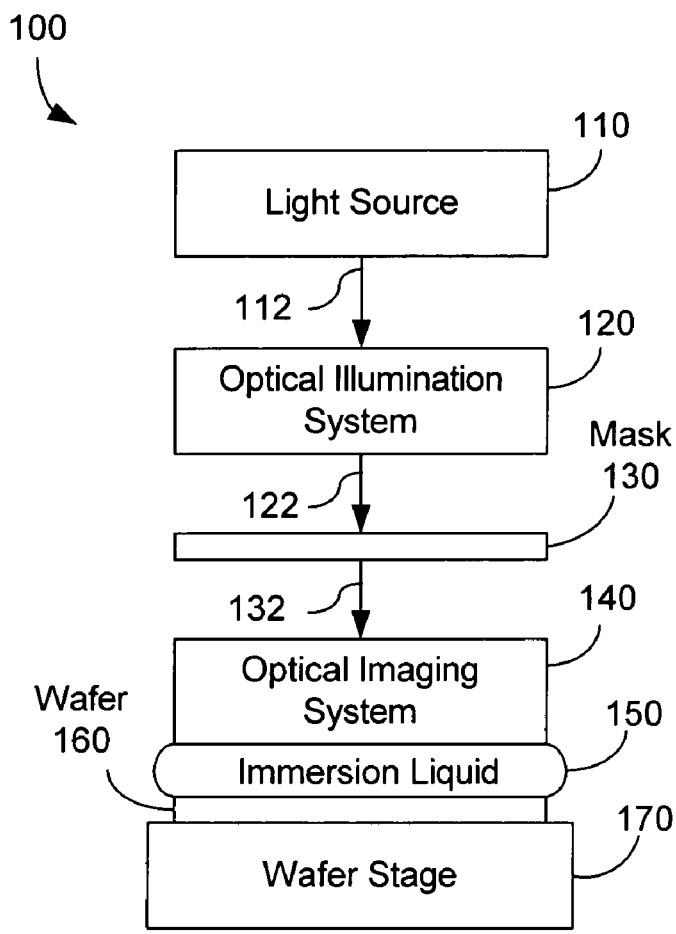
FIG. 1 shows one example of an immersion photolithography system using an immersion liquid described in this application.

FIG. 1 illustrates one example of an immersion lithography system 100 that is suitable for using various immersion liquids described in this application. A wafer stage 170 is used to support and hold a wafer 160 under processing. A light source 110 is provided to produce light 112 in the UV spectrum, such as UV and deep UV light at a wavelength of 248 nm, 193 nm, 157 nm, or even shorter wavelengths under 100 nm. An illumination optical system 120 is then used to modify light 112 into a collimated beam 122 to illuminate a mask 130 with a predefined geometric pattern in connection with circuit components or other features to be formed on the wafer 160. The beam 122 may either be reflected by the mask 130 or transmit through the mask 130 to become a beam 132 imprinted with the predefined geometric pattern. The mask 130 may be designed to produce a spatial phase modulation, an intensity modulation, or a combination of both phase and intensity modulations across the beam 132 to represent the predefined geometric pattern. Next, an imaging optical system 140 focuses and images the predefined geometric pattern in the beam 132 onto the wafer 160 to illuminate a photoresist layer to be patterned by the photolithographic process.

Notably, an immersion liquid 150 with an index of n is used to fill the space between the imaging optical system 140 and the photoresist layer on the wafer 160 and is in contact with both the output optical surface of the optical imaging system 140 and the photoresist layer on the wafer 160. This use of the immersion liquid 150 increases the NA of the system by a factor of n and thus reduces the minimal pitch in the image projected on the photoresist layer by a factor of n in comparison with the same system without the immersion liquid 150. The immersion liquid 150 may be implemented with a polymer or oligomer-based immersion liquid.

Figure 2:
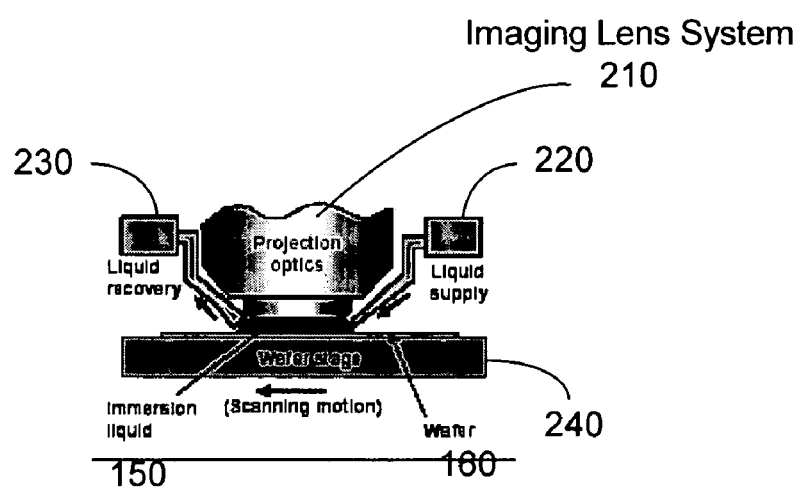
FIG. 2 shows one specific implementation of the immersion photolithography system shown in FIG. 1.

FIG. 2 further shows one implementation of the system 100 in FIG. 1 where an imaging lens system 210 is implemented to operate as the imaging system 140 in FIG. 1. A scanner stage 240 is used to hold the wafer 160 and to change the position of the wafer relative to the imaging lens system 210 so that different parts of the wafer 160 can be exposed. A liquid supply module 240 may be used to supply the immersion liquid 150 to the space between the imaging lens system 210 and the wafer 160 and a liquid recovery module 230 may be used to recover the immersion liquid 150. The liquid supply module 240 and the liquid recovery module 230 may be used to recycle water or a water-based immersion liquid to maintain the quality of the liquid for properly performing the lithography. The water or water-based immersion liquid may be doped with one or more additives to improve the performance.

In one implementation, the immersion liquid 150 may use a polymer or oligomer material as the immersion medium. The suitable polymer or oligomer material may have a low glass transition temperature (Tg) below a normal operation temperature range for the immersion lithography (e.g., the room temperature) and is a liquid in the normal operation temperature range. The suitable polymer or oligomer material may have a relatively high refractive index, e.g., greater than 1.3 or greater than 1.4, in order to achieve a desired high optical NA. As a comparison, a commonly-used immersion liquid is water which has an index of about 1.3. Use of polymer or oligomer materials can have an index greater than 1.3 and thus provides superior optical performance than water. The index of refraction of the immersion liquid may be matched as closely as possible to the index of the last lens element in the optical imaging system. This match in the indices is to eliminate optical diffraction and to increase the numerical aperture of the imaging system.

In addition to the optical performance, the suitable polymer or oligomer material for the immersion liquid 150 may possess certain desired physical or chemical properties for other aspects of the immersion lithography. For example, the immersion liquid 150 is in direct contact with the photoresist layer on the wafer 160 before, during, and after the exposure to the light. In many applications, this direct contact should not adversely affect the photoresist layer, and preferably, may be designed to assist or facilitate the photoresist layer to properly perform its functions in the lithography processing.

Accordingly, in some implementations, a suitable polymer or oligomer material for the immersion liquid 150 may be selected so that it does not dissolve component compounds in the photoresist layer. This is in part because the photoresist may not function properly when certain component compounds in the photoresist are soluble in the immersion liquid 150 and thus are partially or completely removed from the photoresist layer. One example of such component compounds is the photo acid generator (PAG) in the chemically amplified photoresist for DUV photolithography processing. PAG is photoactive and produces acid upon exposure to radiation to deprotect the resist. Therefore, if the concentration of the PAG in the photoresist layer is reduced such as by dissolving into the immersion liquid 150, the deprotecting of the resist can be adversely affected. The composition of the suitable polymer or oligomer material can be specifically selected so that the PAG is not soluble in the immersion liquid 150. By comparison, many PAGs are soluble in water. Hence, polymer or oligomer materials can be used as the immersion liquid 150 to mitigate this adverse aspect of water.

The suitable polymer or oligomer material for the immersion liquid 150 may also be selected to have a low surface energy or viscosity on the photoresist surface so that the immersion liquid 150 does not have the tendency to stick on the photoresist surface after the exposure. The structure of the suitable polymer or oligomer material may be designed to tune the surface energy or the wettability of the immersion liquid 150 on the photoresist surface. In this regard, the suitable polymer or oligomer material for the immersion liquid 150 may be selected or designed to be hydrophobic to reduce any mixing or penetration into photoresist and thus reduce the interaction with the photoresist. The polymer or oligomer material may be selected to have a high molecular weight.

Another technical issue associated with immersion lithography is the surface contamination or poisoning of the photoresist due to the direct contact between the immersion liquid and the photoresist. One of the adverse effects of the surface poisoning is degraded performance of the contaminated photoresist in patterning. The reaction between the photoresist and the immersion liquid or certain components or impurities in the immersion liquid can alter the chemical properties of the photoresist so that the contaminated areas may become chemically non-uniform or may be difficult to remove by etching, ashing, chemical stripping, or a combination of these methods. As a result, the subsequent patterning is no longer well defined by the photoresist. For example, the photoresist poisoning may cause the exposed pattern areas of the photoresist layer to have a photoresist profile or structure with non-uniform side walls. Water as the immersion liquid, for example, may contain impurities that can cause such surface poisoning. The water may also react with the photoresist to reduce the concentration of the PAG. Deactivation of the acid ups may lead to widening of the photoresist line. The composition of the suitable polymer or oligomer material for the immersion liquid 150 may be selected so that any adverse reaction between the photoresist and the immersion liquid 150 is mitigated.

Furthermore, since the immersion liquid 150 is in contact with both the photoresist and the optical surface of the imaging system 140 during the exposure process in the system of FIG. 1, the immersion liquid 150 may be selected or designed to have a lubricating property and thus can function as a lubricant between the optical imaging system 140 and the photoresist layer in some implementations. Various polymer or oligomer materials such as the Si-based materials described below tend to exhibit such a lubricating property. This is an additional benefit for using a polymer or oligomer material as the immersion liquid.

The suitable polymer or oligomer material for the immersion liquid 150 may be a polymer or oligomer material that includes silicon with a low glass transition temperature. For example, certain siloxane polymers may be used as the immersion liquid 150. Such a polymer or olegomer is a liquid at room temperature when the molecular weight is relatively low. The friction of silicon to wafer is minimum due to extremely low surface energy. Viscosity and surface energy are tunable to meet the immersion requirements by tailoring the polymer structure. After exposure, the remaining material on the resist surface is emulsified or dissolved in water base developer and can be completely removed after wet etch.

As a specific example of the siloxane polymers, polydimethylsiloxane (PDMS) may be used as the immersion liquid 150. The structure of PDMS is [—Si(CH3)2—O—Si(CH3)2-O-]x where x is a positive integer for the number of the basic unit expressed in [ ]. The glass transition temperature of this PMDS is about −125° C. and thus is well below the normal operating temperature. The refractive index n of the PDMS is large and is in the range of from about 1.4 to about 1.5.

Another specific example of the siloxane polymers for implementing the immersion liquid 150 is a block polymer based on PDMS:

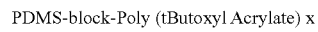

PDMS-block-Poly (tButoxyl Acrylate) x where PDMS is modified into a block polymer which is water soluble after exposure. The number x may be less than 10, e.g., approximately in a range from 3 to 5. The glass transition temperature Tg and the refractive index n remain essentially the same as PDMS. As yet another example for a siloxane polymer in the immersion liquid 150 is a polymer that includes [—Si(CH3)2-O—Si(CH3)2-O-]x-Poly(tButoxyl Acrylate)y, where x and y are integers.

As described above, water or water-based immersion liquids have certain disadvantages. However, these limitations of water or water-based immersion liquids may be mitigated by adding certain additives. In this regard, this application provides one or more suitable material additives for the water-based immersion liquid to facilitate the immersion lithography process. Such additives may be added to water or a water-based immersion liquid to improve or enhance various performance aspects of the immersion liquids.

For example, certain additives may be used to mitigate detrimental interactions between the photo resist and water or a water-based solution as the immersion liquid 150; certain additives may improve selected properties of the immersion liquid 150; other additives may be used to enhance the performance of the photoresist on the wafer 160. An additive may be used to achieve a combination of these beneficial effects. Notably, an additive may be used to improve the performance of the photoresist without directly changing the chemical composition and structure of a particular photoresist. Therefore, the use of additives allows for engineering the combined system of the immersion liquid 150 and the photoresist on the wafer 160. The additives may be added into the immersion liquid 150 that is in contact with the final lens element of the optical imaging system 140 and the top surface of the photoresist on the wafer 160.

Properties that may be imparted to the photoresist via incorporation into the immersion liquid 150 include but are not limited to (1) enhanced wet ability of the immersion fluid in contact with the photo resist, (2) reduction of surface poisoning of the resist in contact with the fluid, (3) improvements of the resist performance including reduction of line width roughness (LWR), enhancements of of either or both of the resolution or depth of focus (DOF), improvement of the etch resistance, reduction of the side lobe margin, and (4) modulation of development of the resist prior to the post exposure bake (PEB) such as modulation of either or both of the top loss and swelling of resist.

Classes of materials that may be used as additives in the immersion liquid for improving the performance of the photoresist include but are not limited to surfactant (anionic, cationic, nonionic, etc.), photo acid generator (PAG), acid, base, buffer, salt, developer, and plasticizer.

Examples of surfactant additives include materials having moieties that have carbon or silicon and are either ionic (anionic and cationic) or nonionic. Such materials may include molecular species, telomers, oligomers and polymers. More specific examples of such materials are siloxane, fluorinated siloxane, alkane, fluorinated alkane, polyether and fluorinated polyether derivatives. Such flourinated polyether derivatives may include alcohols, carboxylates, esters, sulfonates, sulfonamides, phosphates, or ammonium salts. Acetylenic diol surfactants may also be used in order to improve wetability.

Some examples for Photo Acid Generator (PAG) include PAG aryl, olefinic and alkyl sulfonium salts, iodonium salts, imides, and triphenyl sulfonium nonaflate. The absorption band of such materials should overlap with the optical wavelength of the light used for exposure.

Some examples of the acid additives include mineral acids such as HCl, H2SO4, H3PO4, and organic acids such as alkyl and fluorinated alkyl sulfonic, fluorinated alkyl sulfonamide and tris(fluoroalkylalkylsulfoxide)methane (Rf-S(O)2)3CH. Some examples for base additives include alkyl, substituted alkyl amines, ammonium hydroxides, fluorides R1R2R3N and R1R2R3R4N+ X− where R is alkyl ($C_nH_{2n+1}$) or substituted alkyl, X is OH— or F—.

Some examples of salt additives include salts formed from bases and acids listed above. Ammonium salts may be used, e.g., to later dissolution kinetics.

Some examples of the buffer additives include mixtures of salts and acids described above.

Suitable developer additives may include TMAH and developer aqueous solutions of alcohols, acetone or substituted ammonium hydroxides (substituents).

Examples for plasticizer additives include carbon and silicon containing moieties (e.g., molecular species, telomers, oligomers) and polymers (e.g., siloxane and fluorinated siloxane), alkane, fluorinated alkane, polyether and fluorinated polyether derivatives comprising alcohols, carboxylates, and esters.

Only a few implementations are described. However, it is understood that variations and enhancements may be made.

What is claimed is:

1. A system, comprising:
    an optical illumination module to project an illumination beam;
    a mask located in a path of the illumination beam and having an optical pattern to superimpose the optical pattern on the illumination beam;
    an optical imaging module located to receive the patterned illumination beam and to focus the patterned illumination beam to an imaging plane;
    a wafer stage to hold a wafer at the imaging plane; and
    an immersion liquid comprising a siloxane polymer and filled between the wafer and the optical imaging module to transmit the patterned illumination beam to the wafer, wherein the polymer comprises [—Si(CH3)2-O—Si(CH3)2-O-]x-Poly(tButoxyl Acrylate)y, where x and y are integers.

2. The system as in claim 1, wherein the immersion liquid comprises:
    water; and
    an additive added to the water and comprising a surfactant.

3. The system as in claim 2, wherein the surfactant comprises a moiety that has carbon or silicon.

4. The system as in claim 1, wherein the immersion liquid comprises:
    water; and
    an additive added to the water and comprising a photo acid generator.

5. The system as in claim 4, wherein the photo acid generator comprises an aryl.

6. The system as in claim 1, wherein the immersion liquid comprises:
    water; and
    an additive added to the water and comprising a base.

7. The system as in claim 6, wherein the base comprises alkyl.

8. The system as in claim 1, wherein the immersion liquid comprises:
    water; and
    an additive added to the water and comprising a buffer.

9. The system as in claim 8, wherein the buffer comprises a mixture of a salt and an acid.

10. The system as in claim 1, wherein the immersion liquid comprises:
    water; and
    an additive added to the water and comprising a salt.

11. The system as in claim 10, wherein the salt is an ammonium salt.

12. The system as in claim 1, wherein the immersion liquid comprises:
    water; and
    an additive added to the water and comprising a plasticizer.

13. The system as in claim 12, wherein the plasticizer comprises a moiety that comprises carbon or silicon.

* * * * *